US010818316B2

(12) United States Patent
Hisakuni et al.

(10) Patent No.: US 10,818,316 B2
(45) Date of Patent: Oct. 27, 2020

(54) ACTUATOR ASSEMBLY OF DISK DEVICE AND DISK DEVICE COMPRISING THE SAME

(71) Applicants: Kabushiki Kaisha Toshiba, Minato-ku, Tokyo (JP); Toshiba Electronic Devices & Storage Corporation, Minato-ku, Tokyo (JP)

(72) Inventors: Yousuke Hisakuni, Sagamihara Kanagawa (JP); Kota Tokuda, Kawasaki Kanagawa (JP); Nobuhiro Yamamoto, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/353,171

(22) Filed: Mar. 14, 2019

(65) Prior Publication Data

US 2020/0090689 A1    Mar. 19, 2020

(30) Foreign Application Priority Data

Sep. 14, 2018    (JP) .................................. 2018-172403

(51) Int. Cl.
*G11B 5/48*    (2006.01)
*H05K 1/18*    (2006.01)
*H05K 1/02*    (2006.01)

(52) U.S. Cl.
CPC ........... *G11B 5/4813* (2013.01); *H05K 1/028* (2013.01); *H05K 1/181* (2013.01); *H05K 2201/10159* (2013.01)

(58) Field of Classification Search
CPC .................................................. G11B 5/4813
USPC .................................. 360/244–244.7, 244.5
See application file for complete search history.

(56) References Cited

U.S. PATENT DOCUMENTS

| 5,583,720 | A |  | 12/1996 | Ishida et al. |
| 5,886,858 | A |  | 3/1999 | Yanagihara |
| 6,236,531 | B1 | * | 5/2001 | Allsup ................. G11B 5/4846 360/264.2 |
| 7,119,993 | B2 | * | 10/2006 | Zuo ...................... G11B 5/4813 360/264.2 |
| 7,158,350 | B1 | * | 1/2007 | Carlson ................. G11B 5/486 360/266.3 |
| 7,466,518 | B1 | * | 12/2008 | Bjorstrom ............ G11B 5/4826 360/244.5 |

(Continued)

FOREIGN PATENT DOCUMENTS

| JP | H03-5296 U | 1/1991 |
| JP | 2642922 B2 | 8/1997 |

(Continued)

*Primary Examiner* — Allen T Cao
(74) *Attorney, Agent, or Firm* — White & Case LLP

(57) ABSTRACT

According to one embodiment, an actuator assembly includes a head actuator including an actuator block having a first surface, a second surface intersecting the first surface, and a first groove provided on the second surface, and a suspension assembly supporting a magnetic head and a wiring board including a plate arranged on the first surface, a flexible printed circuit board provided on the plate, and an IC chip provided on the flexible printed circuit board, wherein the plate comprises a first engaging portion engaging with the first groove.

18 Claims, 11 Drawing Sheets

(56) References Cited

U.S. PATENT DOCUMENTS

| | | | |
|---|---|---|---|
| 7,515,385 B1 * | 4/2009 | Abrahamson | G11B 5/5569 360/264.6 |
| 9,788,426 B2 | 10/2017 | Ishida et al. | |
| 2005/0068682 A1 | 3/2005 | Sasaki | |
| 2005/0190489 A1 * | 9/2005 | Izumi | H05K 3/0058 360/97.19 |

FOREIGN PATENT DOCUMENTS

| JP | H10-275430 A | 10/1998 |
|---|---|---|
| JP | 2005-108357 A | 4/2005 |

\* cited by examiner

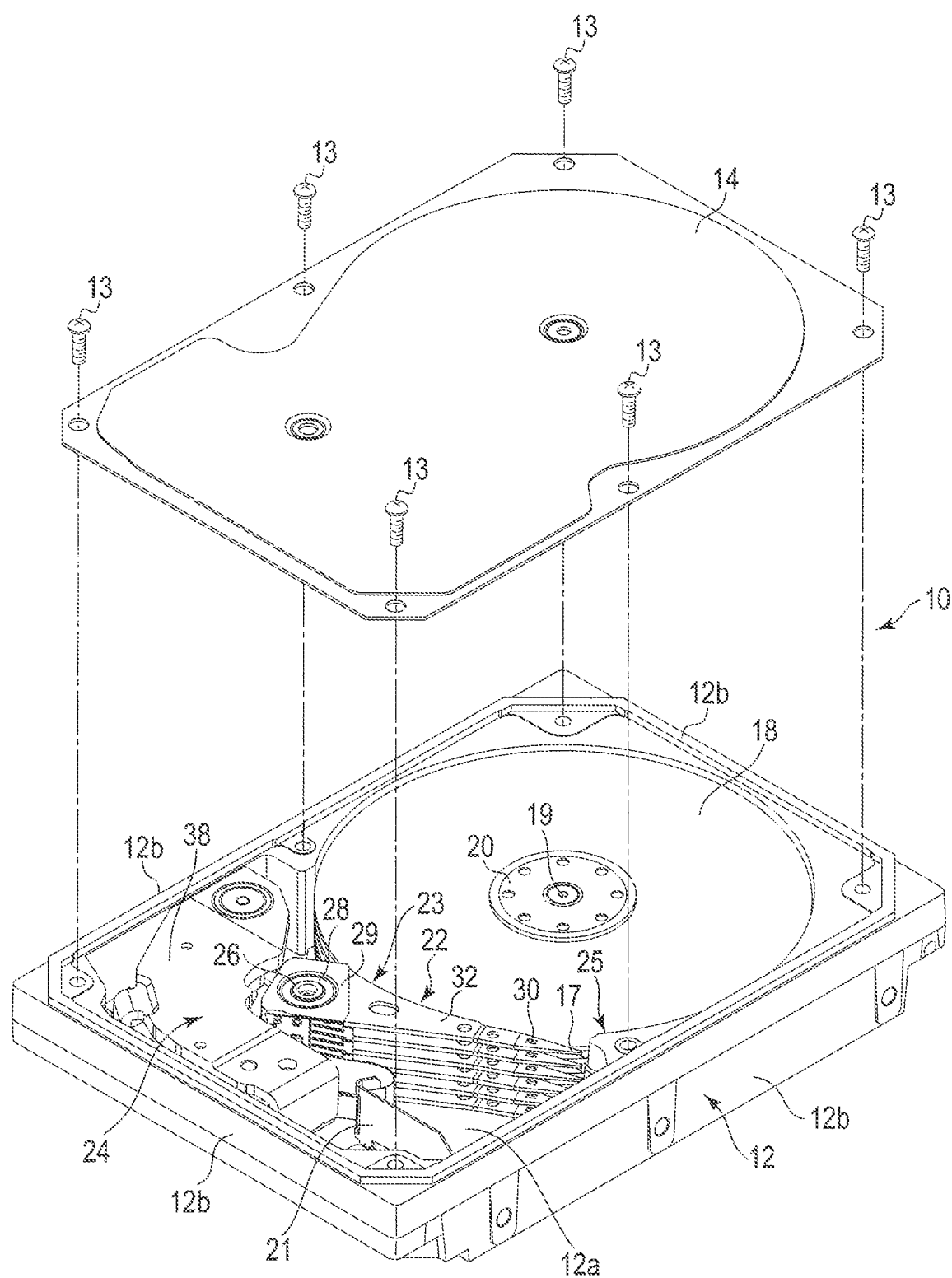
F I G. 1

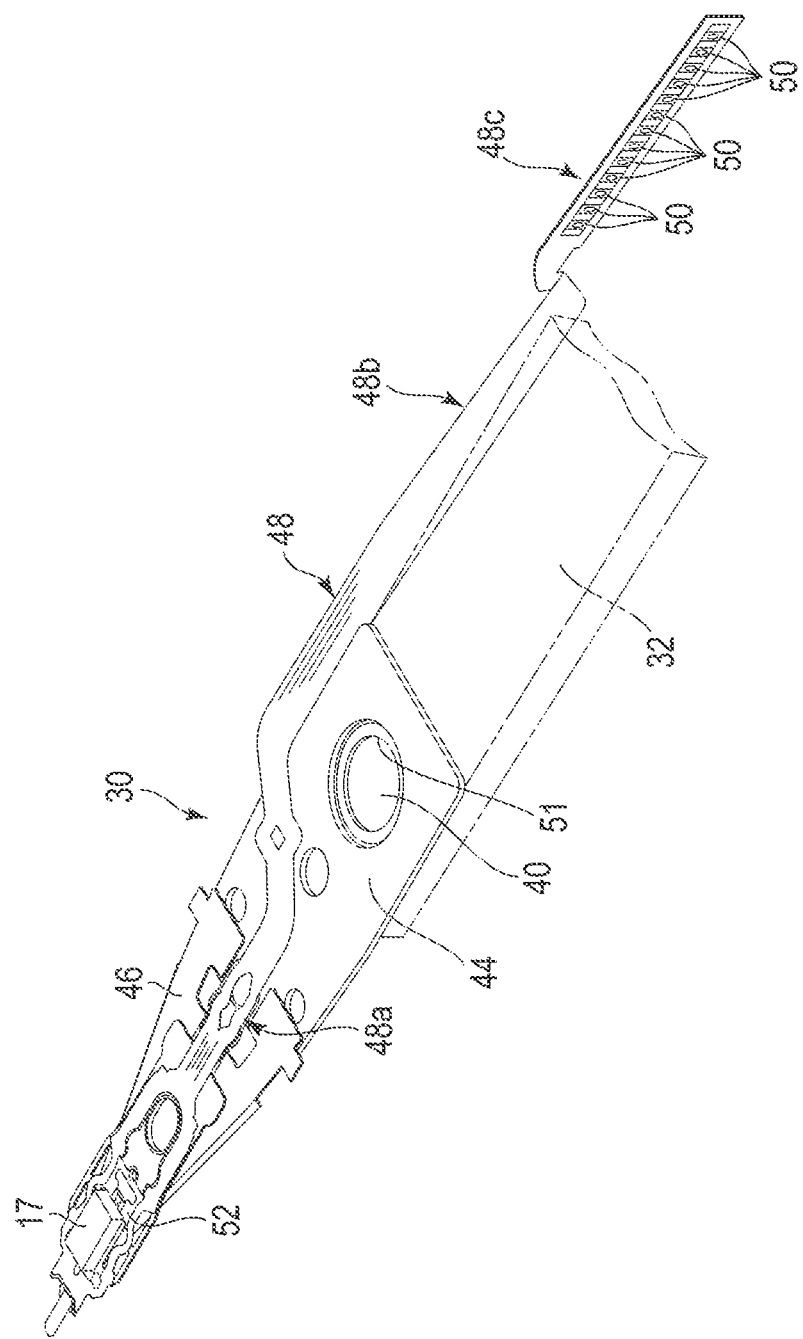
F I G. 3

ACTUATOR ASSEMBLY OF DISK DEVICE AND DISK DEVICE COMPRISING THE SAME

CROSS-REFERENCE TO RELATED APPLICATIONS

This application is based upon and claims the benefit of priority from Japanese Patent Application No. 2018-172403, filed Sep. 14, 2018, the entire contents of which are incorporated herein by reference.

FIELD

Embodiments described herein relate generally to an actuator assembly of a disk device and a disk device comprising the same.

BACKGROUND

As a disk device, for example, a magnetic disk drive generally comprises a magnetic disk provided in a base, a spindle motor which supports and rotates the magnetic disk, an actuator assembly which supports a magnetic head, and the like. In addition, an IC chip is mounted on a flexible printed circuit board (FPC) provided at an actuator block of the actuator assembly. Recently, the number of magnetic disks provided tends to be increased in accordance with an increase in capacity of HDD, and the number of IC chips and the line density on FPC need to be increased proportionally. However, the size of FPC is restricted, and securing space for mounting is difficult.

In addition, a reinforcement plate to reinforce PFC and the FPC are fixed to the actuator block with screws and pins. For this reason, thermal expansion of the reinforcement plate and the FPC caused by heat generated from the IC chips may be stopped by screws and pins, and deformation of FPC and disconnection may be caused by concentration of the thermal stress.

BRIEF DESCRIPTION OF THE DRAWINGS

FIG. 1 is an exploded perspective view showing HDD with a top cover detached.

FIG. 3 is a perspective view showing a suspension assembly.

DETAILED DESCRIPTION

Figure 2:
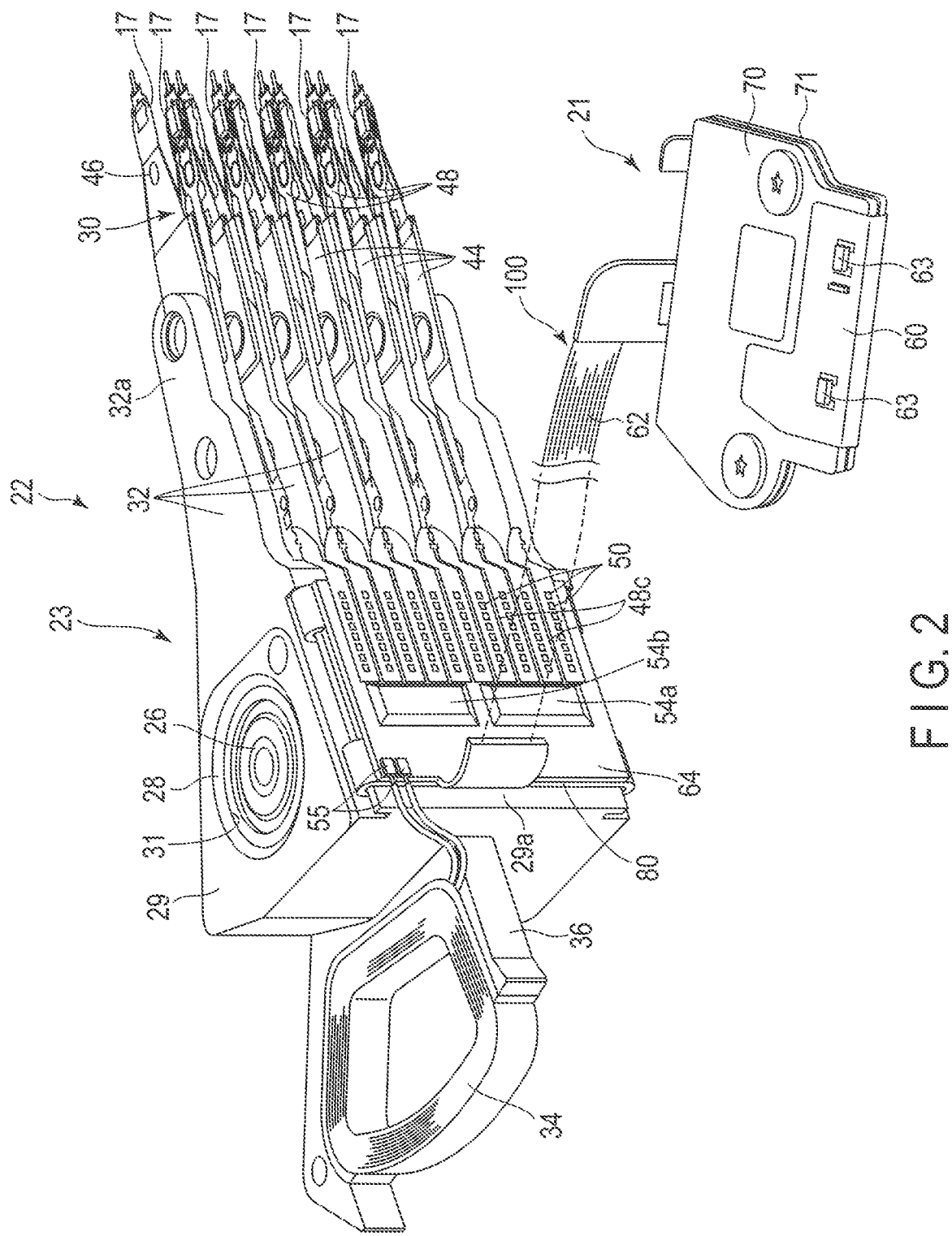
FIG. 2 is a perspective view showing an actuator assembly.

In general, according to one embodiment, there is provided an actuator assembly includes a head actuator comprising an actuator block having a first surface, a second surface intersecting the first surface, and a first groove provided on the second surface, and a suspension assembly supporting a magnetic head and a wiring board comprising a plate arranged on the first surface, a flexible printed circuit board provided on the plate, and an IC chip provided on the flexible printed circuit board, wherein the plate comprises a first engaging portion engaging with the first groove.

A disk device according to embodiments will be described hereinafter with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, and the like, of the respective parts are illustrated schematically in the drawings, rather than as an accurate representation of what is implemented. However, such schematic illustration is merely exemplary, and in no way restricts the interpretation of the invention. In addition, in the specification and drawings, the same elements as those described in connection with preceding drawings are denoted by like reference numbers, and detailed description thereof is omitted unless necessary.

A hard disk drive (HDD) will be described in detail as a disk device.

FIG. 1 is an exploded perspective view showing HDD with a top cover detached.

HDD comprises a housing 10 in a flat and substantially rectangular shape. The housing 10 comprises a base 12 formed in the shape of a rectangular box which is open on its upper side, and a top cover 14. The base 12 includes a rectangular bottom wall 12*a* opposed to and spaced apart from the top cover 14, and sidewalls 12*b* standing along peripheral edges of the bottom wall, and is formed of, for example, aluminum and molded integrally as one body. The top cover 14 is formed of, for example, stainless steel in the shape of a rectangular plate. The top cover 14 is secured to the sidewalls 12*b* of the base 12 by a plurality of screws 13 to close the upper opening of the base 12.

A plurality of magnetic disks 18 serving as recording media, and a spindle motor 18 serving as a driving section which supports and rotates the magnetic disks 18, are provided in the housing 10. The spindle motor 19 is arranged on the bottom wall 12*a*. Each of the magnetic disks 18 has a diameter of, for example, 3.5 inches and includes a magnetic recording layer on its upper surface and/or lower surface. Each of the magnetic disks 18 is coaxially fitted in a hub (not shown) of the spindle motor 19, clamped by a clamp spring 20, and fixed to the hub. Each of the magnetic disks 18 is supported so as to be located parallel to the bottom wall 12*a* of the base 12. The magnetic disks 18 are rotated at a predetermined number of revolutions by the spindle motor 19. In the present embodiment, for example, five magnetic disks 18 are accommodated in the housing 10, but the number of magnetic disks 18 is not limited to this.

An actuator assembly 22 which comprises a plurality of magnetic heads 17 recording information on the magnetic disks 18 and reproducing the information data and which supports the magnetic heads 17 movably to the magnetic disks 18 is provided in the housing 10. In addition, a voice coil motor (hereinafter referred to as VCM) 24 which rotates and positions the actuator assembly 22, and a ramped loading mechanism 25 which holds the magnetic heads 17 at an unloading position spaced apart from the magnetic disks 18 when the magnetic heads 17 are moved to the outermost circumference of the magnetic disks 18, are provided in the housing 10.

The actuator assembly 22 includes a head actuator 23, and a wiring board unit (FPC unit) 21 on which electronic components such as a conversion connector are mounted and which is connected to the head actuator 23. The head actuator 23 includes an actuator block 29 supported to be rotatable around the support shaft 26 via a bearing unit 28, a rotatable bearing unit 28, a plurality of arms 32 extending from the actuator block 29, and suspension assemblies 30 extending from the respective arms 32, and the magnetic heads 17 are supported at distal portions of the respective suspension assemblies 30. The support shaft 26 is provided upright on the bottom wall 12*a*. The magnetic heads 17 include a read element, a write element, and the like.

A printed circuit board (not shown) is fixed by screws, on an outer surface of the bottom wall 12*a* of the base 12. The printed circuit board constitutes the control unit, and the control unit controls the operation of the spindle motor 19, and also controls the operation of the VCM 24 and the magnetic heads 17 via the wiring board unit 21.

FIG. 2 is a perspective view showing the actuator assembly 22. FIG. 3 is a perspective view showing the suspension assembly 30.

The actuator assembly 22 includes the head actuator 23 and the wiring board unit 21. As shown in FIG. 2, the head actuator 23 comprises the actuator block 29 including a transparent hole 31, the bearing unit 28 (unit bearing) 28 provided in the transparent hole 31, a plurality of, for example, six arms 32 extending from the actuator block 29, the suspension assemblies 30 attached to the respective arms 32, and the magnetic heads 17 supported at extended ends of the suspension assemblies 30. The actuator block 29 is supported to be rotatable around the support shaft (axis) 26 provided upright on the bottom wall 12*a*, by the bearing unit 28.

The actuator block 29 and six arms 32 are formed of aluminum or the like and molded as one body to constitute what is called an E block. The arms 32 are formed in a shape of, for example, an elongated flat plate, and extend from the actuator block 29 in a direction perpendicular to the support shaft 26. Six arms 32 are provided parallel and spaced apart from each other.

The head actuator 23 includes a support frame 36 extending in a direction opposite to the arms 32 from the bearing unit 28, and a voice coil 34 which is a part of the VCM 24 by the support frame 36. As shown in FIG. 1, the voice coil 34 is located between a pair of yokes 37 one of which is fixed on the base 12, and constitutes the VCM 24 together with these yokes 38 and a magnet fixed to one of the yokes 38.

The head actuator 23 comprises eight suspension assemblies 30 supporting the magnetic heads 17. The suspension assemblies 30 extend from the actuator block 29 and are attached to the respective distal portions 32*a* of the arms 32. The suspension assemblies 30 include up-head suspension assemblies supporting the magnetic heads 17 upwardly and down-head suspension assemblies supporting the magnetic heads 17 downwardly. The up-head suspension assemblies and the down-head suspension assemblies are configured by arranging the suspension assemblies 30 of the same structure upwardly and downwardly.

In the present embodiment, in FIG. 2, the down-head suspension assembly is attached to the uppermost arm 32 and the up-head suspension assembly is attached to the lowermost arm 32. The up-head suspension assembly and the down-head suspension assembly are attached to each of four middle arms 32.

As shown in FIG. 3, the suspension assembly 30 includes a substantially rectangular base plate 44, a load beam 46 shaped in an elongated leaf spring, and a flexure (wiring member) 48 shaped in an elongated strip. A proximal portion of the load beam 46 is superposed and fixed on an end portion of the base plate 44. The load beam 46 extends from the base plate 44 and is tapered toward an extension end. The base plate 44 and the load beam 46 are formed of, for example, stainless steel.

The base plate 44 includes a circular opening at its proximal portion and an annular projection 51 located along the circumference of the opening. The projections 51 of the base plates 44 are fitted in swaging holes 40 formed at the distal portions 32*a* of the arms 32, the projection 51 are swaged, and the base plates 44 are thereby fastened at the distal portions 32*a* of the arms 32 (see FIG. 2). The proximal portion of the load beam 46 is superposed on the distal portion of the base plate 44, welded at a plurality of portions, and thereby fixed to the base plate 44.

The flexure 48 of the suspension assembly 30 includes a stainless metal pate (backing layer) serving as a base, an insulating layer formed on the metal plate, a conductive layer constituting a plurality of interconnects (wiring pattern) formed on the insulating layer, and a cover layer (protective layer or insulating layer) covering the conductive layer, and is formed as a stacked plate shaped in an elongated strip.

The flexure 48 includes a distal side portion 48*a* and a proximal side portion 48*b*. The distal side portion 48*a* is attached to the load beam 46 and the base plate 44. The proximal side portion 48*b* extends from a side edge of the base plate 44 to the outside and further extends to the proximal portion (actuator block 29) of the arm 32 along the arm 32.

The flexure 48 includes a distal portion located on the load beam 46 and a gimbal portion (elastic support portion) 52 which is formed at the distal portion and can be freely displaced. The magnetic head 17 is mounted on the gimbal portion 52. The interconnects of the flexure 48 are electrically connected to members such as the read element, the write element and the heater of the magnetic head 17.

The flexure 48 includes a connection end portion (tail connection terminal portion) 48c provided at an end of the proximal side portion 48b. The connection end portion 48c is shaped in an elongated rectangle. The connection end portion 48c is bent at substantially right angles to the proximal side portion 48b and located at a position substantially perpendicular to the arm 32. A plurality of, for example, thirteen connection terminals (connection pads) 50 are provided on the connection end portion 48c. The connection terminals 50 are connected to the respective intersects of the flexure 48. That is, the interconnects of the flexure 48 extend along the substantially whole length of the flexure 48, their one-side ends are electrically connected to the magnetic head 17 and the other side ends are connected to the connection terminals (connection pads) 50 of the connection end portion 48c.

As shown in FIG. 2, ten suspension assemblies 30 extend from six arms 32, and are arranged to face substantially parallel to each other and to be spaced apart at regular intervals. The suspension assemblies 30 constitute five down-head suspension assemblies and five up-head suspension assemblies. The down-head suspension assemblies 30 and the up-head suspension assemblies 30 of each set are located parallel to each other and spaced apart at regular intervals, and the magnetic heads 17 are located to face each other. The magnetic heads 17 are located to be opposed to both faces of the corresponding magnetic disks 18.

As shown in FIG. 2, the wiring board unit 21 includes a reinforcing plate 80, a flexible printed circuit board 100, and IC chips 54a and 54b. The reinforcing plate 80 is fixed to the actuator block 29, and its fixing method will be explained later. The flexible printed circuit board 100 includes a substantially rectangular base portion 60, an intermediate portion 62 shaped in an elongated strip extending from a one-side edge or the base portion 60, and a substantially rectangular joint portion 64 provided continuously with the distal portion of the intermediate portion 62. The joint portion 64 is stuck to the reinforcing plate 80. The flexible printed circuit board 100 is constituted as a multilayered circuit board including two conductive layers.

Electronic components such as a conversion connector (not shown) and capacitors 63 are mounted on either surface (outer surface) of the base portion 60 and are electrically connected to interconnects (not shown). Two metal plates 70 and 71 that function as reinforcing plates are stuck to the other surface (inner surface) of the base portion 60. The base portion 60 is folded at 180 degrees at a part between the metal plates 70 and 71 and is superposed such that the metal plates 70 and 71 face each other. The base portion 60 is arranged on the bottom wall 12a of the housing 10 and fixed to the bottom wall 12a by two screws. The conversion connector on the base portion 60 is connected to a control circuit board provided on the bottom surface side of the housing 10.

The intermediate portion 62 extends from the side edge of the base portion 60, substantially perpendicularly to the side edge, and further extends at substantially right angles, toward the head actuator 23.

The joint portion 64 provided at the extension end of the intermediate portion 62 is stuck to an installation surface 29a of the actuator block 29 via the reinforcing plate 80 formed of aluminum or the like.

The connection end portions 48c of twelve flexures 48 are joined to the connection portions of the joint portion 64 and electrically connected to the interconnects of the joint portion 64. The connection end portions 48c are arranged in a direction parallel to the support shaft 26. The IC chips (head amplifiers) 54a and 54b are mounted on the joint portion 64, and connected to the connection end portions 48c and the base portion 60 via the interconnects of the FPC. The IC chips 54a and 54b are arranged in a direction parallel to the support shaft 26. Furthermore, the joint portion 64 includes a pair of connection pads 55, and a voice coil 34 is connected to the connection pads 55.

Each of ten magnetic heads 17 of the actuator assembly 22 is electrically connected to the base portion 60 through the interconnect of the flexure 48, the connection end portion 48c, the joint portion 64 of the wiring board unit 21, and the intermediate portion 62. Furthermore, the base portion 60 is electrically connected to the printed circuit board on the bottom surface side of the housing 10 via the conversion connector.

Next, a first embodiment will be explained with reference to FIG. 4 to FIG. 6.

Figure 4:
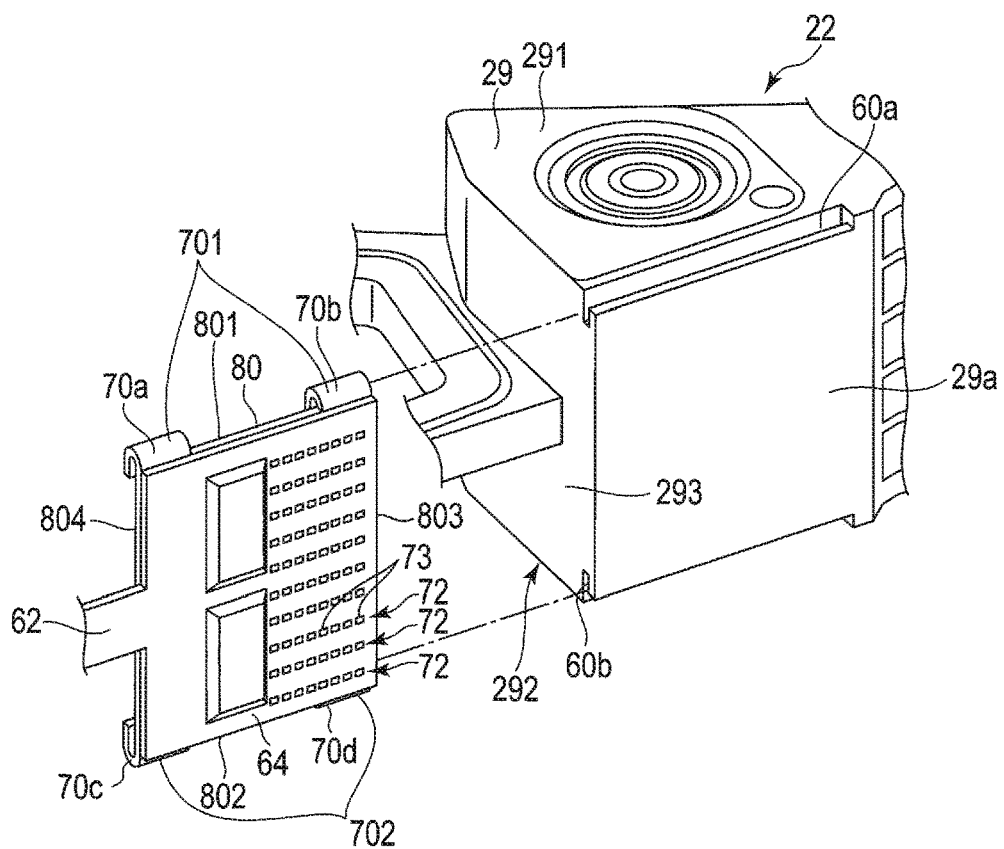
FIG. 4 is a perspective view showing a method of fixing the reinforcement plate according to a first embodiment.

FIG. 4 is a perspective view showing a method of fixing the reinforcing plate 80 according to the first embodiment. FIG. 5 is a perspective view showing a state in which the reinforcing plate 80 is fixed to the actuator block 29 in the steps of FIG. 4. FIG. 6 is a cross-sectional view showing an actuator assembly 22 shown in FIG. 5 seen along line I-I'.

The actuator block 29 includes an installation surface (a first surface) 29a, a second surface 291 and a third surface 292 intersecting with the installation surface 29a and extending, and a side surface 293 intersecting with the installation surface 29a and extending between the second surface 291 and the third surface 292. The second surface 291 and the third surface 292 are spaced apart and opposed to each other. In addition, the actuator block 29 includes a first groove 60a formed in a direction from the second surface 291 to the third surface 292, and a second groove 60b formed in a direction from the third surface 292 to the second surface 291.

The joint portion 64 includes a connection pad group 72 corresponding to the connection end portions 48c of the suspension assemblies 30. Each connection pad group 72 includes connection pads 73 arranged in a row, and each of the connection pads 73 is electrically connected to the base portion 60 via the interconnects. The connection pads 73 of each connection pad group 72 are arranged in a row in a direction substantially parallel to the arm 32 and spaced apart at regular intervals. In addition, the connection pad groups 72 are spaced apart from each other at regular intervals, in a direction parallel to the support shaft 26, i.e., a height direction of the actuator block 29, and arranged substantially parallel to each other.

The reinforcing plate 80 includes a first end portion 801 located on the second surface 291 side, a second end portion 802 located on the third surface 292 side, a third end portion 803 connecting the first end portion 801 and the second end portion 802, and a fourth end portion 804 on the opposite side of the third end portion 803. The intermediate portion 62 extends from the fourth end portion 804. In addition, the reinforcing plate 80 includes a first engaging portion 701 extending from the first end portion 801 and a second engaging portion 702 extending from the second end portion 802. The reinforcing plate 80 is held on the installation surface 29a by the first engaging portion 701 and the second engaging portion 702. In the example illustrated, the first engaging portion 701 is composed of two folded portions, i.e., a first portion 70a and a second portion 70b. The second portion 70b is apart from the first portion 70a. The second engaging portion 702 is composed of two folded portions, i.e., a third portion 70c and a fourth portion 70d. The fourth portion 70c is apart from the third portion 70c. The first portion 70a and the third portion 70c are located on the fourth end portion 804 side, and the second portion 70b and the fourth portion 70d are located on the third end portion 803 side.

Figure 5:
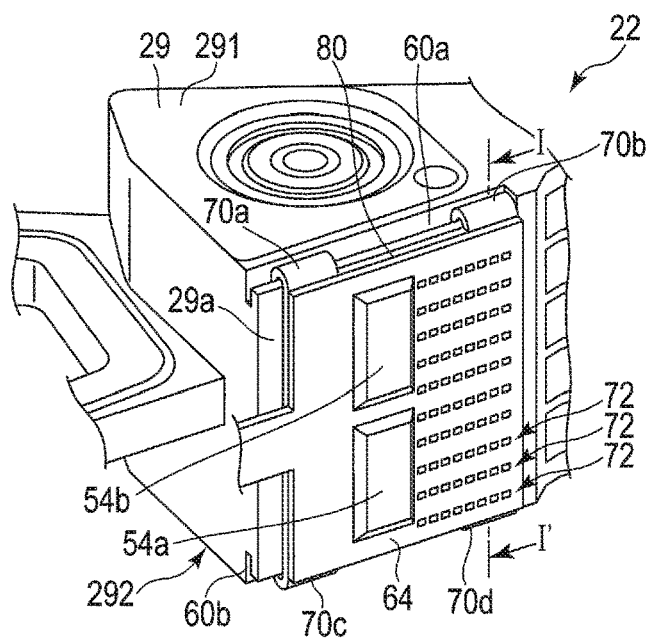
FIG. 5 is a perspective view showing a state in which the reinforcement plate is fixed to the actuator block in steps of FIG. 4.

As shown in FIG. 4 and FIG. 5, the reinforcing plate 80 is slid from the side surface 293 side in a direction of extension of the first groove 60a and the second groove 60b, and is thereby arranged to face the installation surface 29a. That is, the first portion 70a and the second portion 70b slide to be engaged with the first groove 60a, and the third portion 70c and the fourth portion 70d slide to be engaged with the second groove 60b. In addition, the first engaging portion 701 and the second engaging portion 702 are fixed by being swaged by the first grove 60a and the second groove 60b, respectively.

As shown in FIG. 5, the uppermost positions of the first portion 70a and the second portion 70b are located below the second surface 291, and the lowermost positions of the third portion 70c and the fourth portion 70d are located above the third surface 292. That is, the first engaging portion 701 and the second engaging portion 702 do not protrude from the actuator block 29 in the lateral direction. In addition, since thermal stress is generated about the IC chips 54a and 54b, the first portion 70a, the second portion 70b, the third portion 70c, and the fourth portion 70d are desirably displaced from the line in which the IC chips 54a and 54b are arranged parallel to suppress the thermal stress concentrating on the fixed portion. In the example illustrated, the IC chips 54a and 54b are located between the line in which the first portion 70a and the third portion 70c are formed and the line in which the second portion 70b and the fourth portion 70d are formed. In addition, since the connection pad groups 72 and the connection end portions 48c are connected on the side of the reinforcing plate 80 on which the connection pad groups 72 are arranged, the first engaging portion 701 and the second engaging portion 702 are desirably fixed such that the connection pad groups 72 are not displaced from the connection end portions 48c. In the example illustrated, the reinforcing plate 80 is fixed by the second portion 70b and the fourth portion 70d, on the side on which the connection pad groups 72 are arranged.

Figure 6:
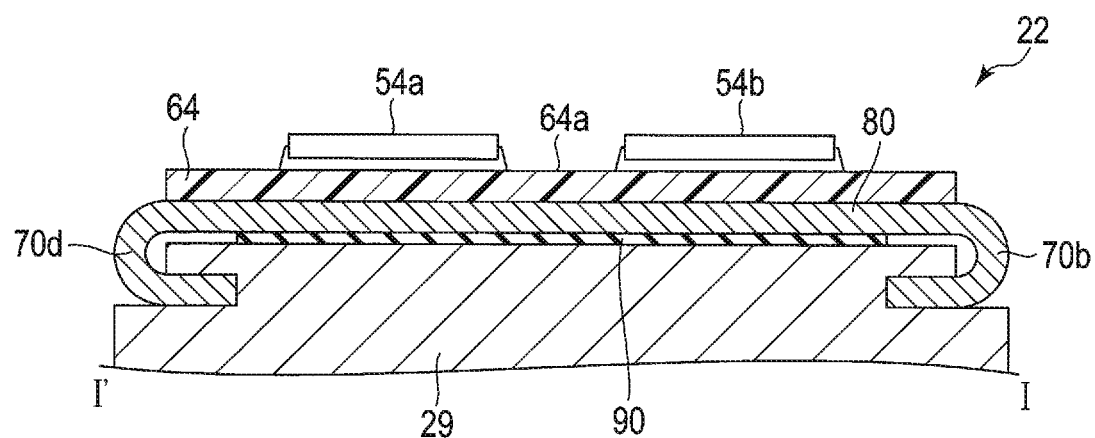
FIG. 6 is a cross-sectional view showing an actuator assembly shown in FIG. 5 seen along line I-I'.

As shown in FIG. 6, the actuator assembly 22 further includes an adhesive material 90 located between the actuator block 29 and the reinforcing plate 80. The adhesive material 90 is formed of, for example, a material having adhesion and heat conduction such as a radiator sheet, grease, adhesive or the like. Wobble of the reinforcing plate 80 can be suppressed and heat radiation from the IC chips 54a and 54b to the actuator block 29 can be improved, by the adhesive material 90. For example, if the adhesive material 90 is an adhesive, a gap between the actuator block 29 and the reinforcing plate 80 may be filled with the adhesive.

According to the present embodiment, the reinforcing plate 80 and the joint portion 64 are fixed to the actuator block 29 by the first engaging portion 701 and the second engaging portion 702. For this reason, the reinforcing plate 80 and the joint portion 64 can be fixed to the actuator block 29 without using fixing members such as screws or pins. If fixing members are used, the other members cannot be mounted on the portions where the fixing members are located or their surroundings, on a surface 64a of the joint portion 64. In the configuration of the present embodiment, an area to mount the IC chips, interconnects, and the like can be increased since screws, pins, or the like are not located on the surface 64a of the joint portion 64. Therefore, increase in size of the IC chips mounted on the joint portion 64, increase the number of IC chips, higher density of the interconnects can be implemented to increase the capacity of HDD.

In addition, since the fixing members inhibit thermal contraction and thermal expansion of the reinforcing plate 80 and the joint portion 64, stress may be generated between the IC chips 54a and 54b, and the fixing members such as screws and the IC chips 54a and 54b, and deformation, break or the like of the joint portion 64 may occur. As described in the present embodiment, thermal contraction and thermal expansion of the reinforcing plate 80 and the joint portion 64 are not inhibited and concentration of the thermal stress can be suppressed by using no fixing members. The thermal fatigue lifetime of copper foil constituting the joint portion 64 can be therefore increased.

In the example illustrated, the first engaging portion 701 is composed of two folded portions, i.e., a first portion 70a and a second portion 70b, but the number of the first engaging portions 701 may be one or three more. The number of the second engaging portions 702 may be one or three more. In addition, two IC chips are mounted on the joint portion 64 but one large IC chip alone may be mounted. The number of IC chips mounted on the joint portion 64 is not limited.

Figure 8:
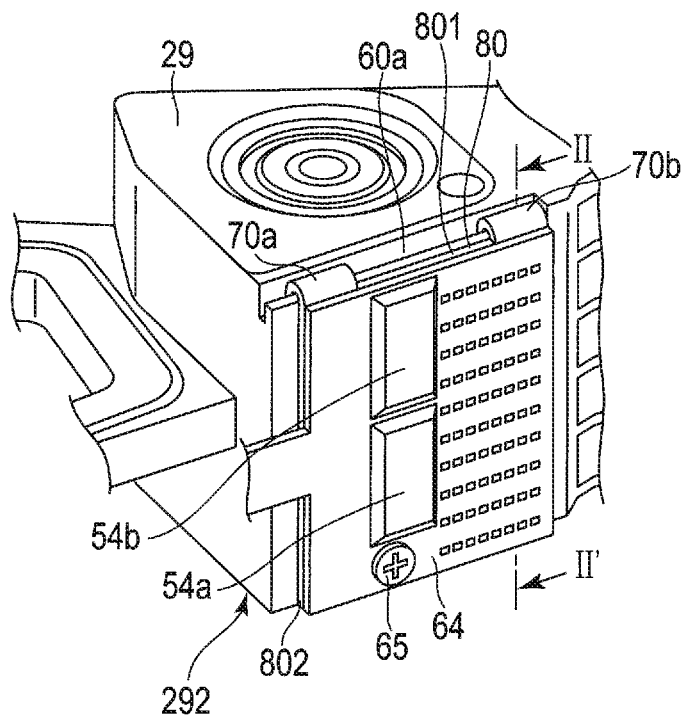
FIG. 8 is a perspective view showing a state in which the reinforcement plate is fixed to the actuator block in steps of FIG. 7.
Figure 9:
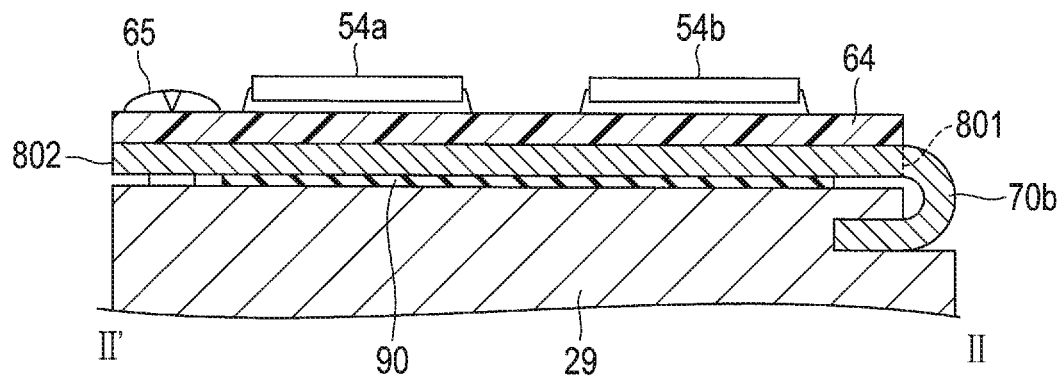
FIG. 9 is a cross-sectional view showing an actuator assembly shown in FIG. 8 seen along line II-II'.

Next, a first modified example of the first embodiment will be explained with reference to FIG. 7 to FIG. 9.

Figure 7:
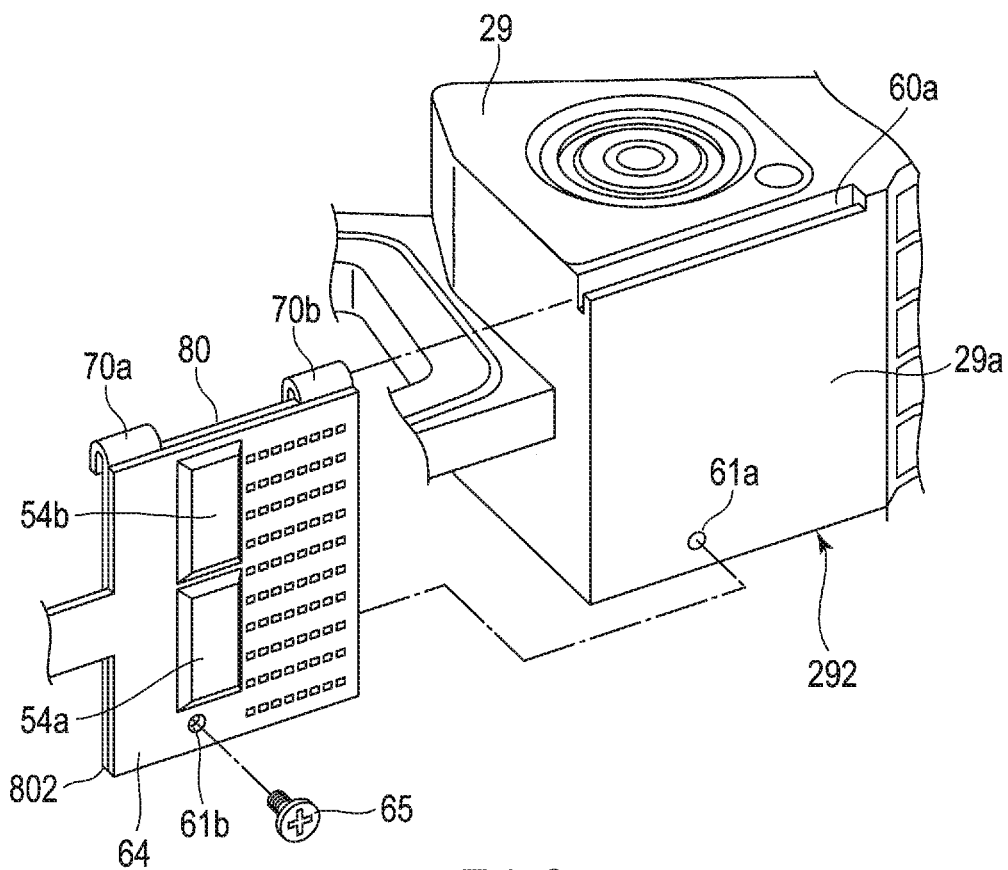
FIG. 7 is a perspective view showing a method of fixing the reinforcement plate according to a first modified example of the first embodiment.

FIG. 7 is a perspective view showing a method of fixing the reinforcing plate 80 according to the first modified example of the first embodiment. FIG. 8 is a perspective view showing a state in which the reinforcing plate 80 is fixed to the actuator block 29 in the steps of FIG. 7. FIG. 9 is a cross-sectional view showing an actuator assembly 22 shown in FIG. 8 seen along line II-II'. The first modified example is different from the first embodiment with respect to a feature that the reinforcing plate 80 and the joint portion 64 are fixed to the installation surface 29a by a screw 65, on the third surface 292 side.

As shown in FIG. 7, the actuator block 29 includes a screw hole 61a formed in the installation surface 29a. The reinforcing plate 80 and the joint portion 64 screw holes 61b which penetrate both the reinforcing plate 80 and the joint portion 64 on the second end portion 802 side from the IC chip 54a. After the reinforcing plate 80 is arranged on the installation surface 29a, the reinforcing plate 80 is fixed by inserting the screw 65 through the screw holes 61a and 61b. As shown in FIG. 8, the reinforcing plate 80 is fixed to the actuator block 29 by the screw 65, on the second end portion 802 side from the IC chip 54a. The first end portion 801 side is the same as that in the first embodiment.

Close contact between the reinforcing plate 80 and the actuator block 29 can be improved and the wobble of the reinforcing plate 80 can be suppressed by fixing the either side of the reinforcing plate 80 by the screw 65. In addition, since thermal contraction and thermal expansion occur on the first end portion 801 side on which the reinforcing plate 80 and the joint portion 64 are not fixed by the screw, concentration of thermal stress can be relieved similarly to the first embodiment. Furthermore, bending and swaging of the first portion 70a and the second portion 70b may be executed while the reinforcing plate 80 is fixed by the screw 65, and the manufacturing efficiency can be improved.

Figure 11:
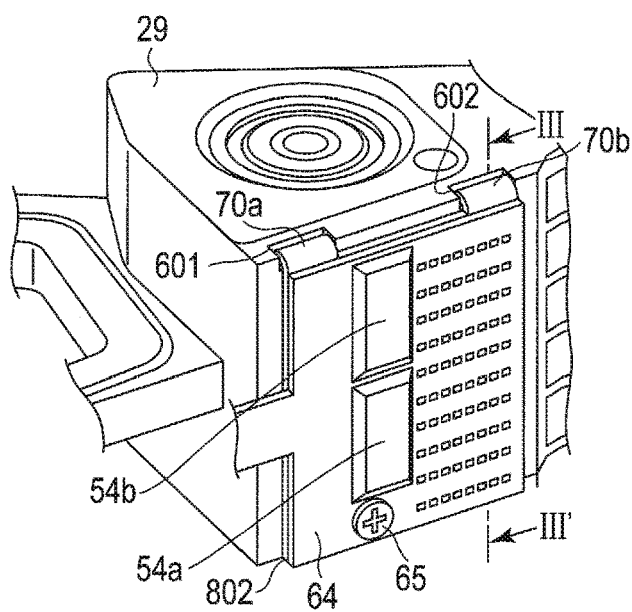
FIG. 11 is a perspective view showing a state in which the reinforcement plate is fixed to the actuator block in steps of FIG. 10.
Figure 12:
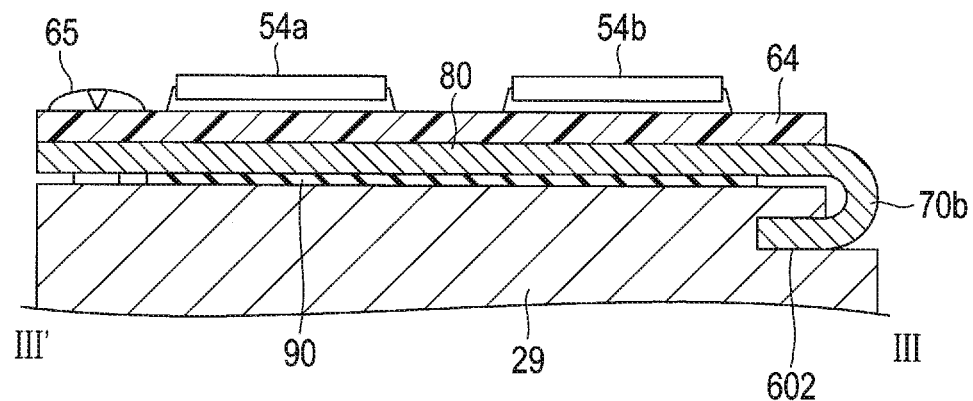
FIG. 12 is a cross-sectional view showing an actuator assembly shown in FIG. 11 seen along line III-III'.

Next, a second modified example of the first embodiment will be explained with reference to FIG. 10 to FIG. 12.

Figure 10:
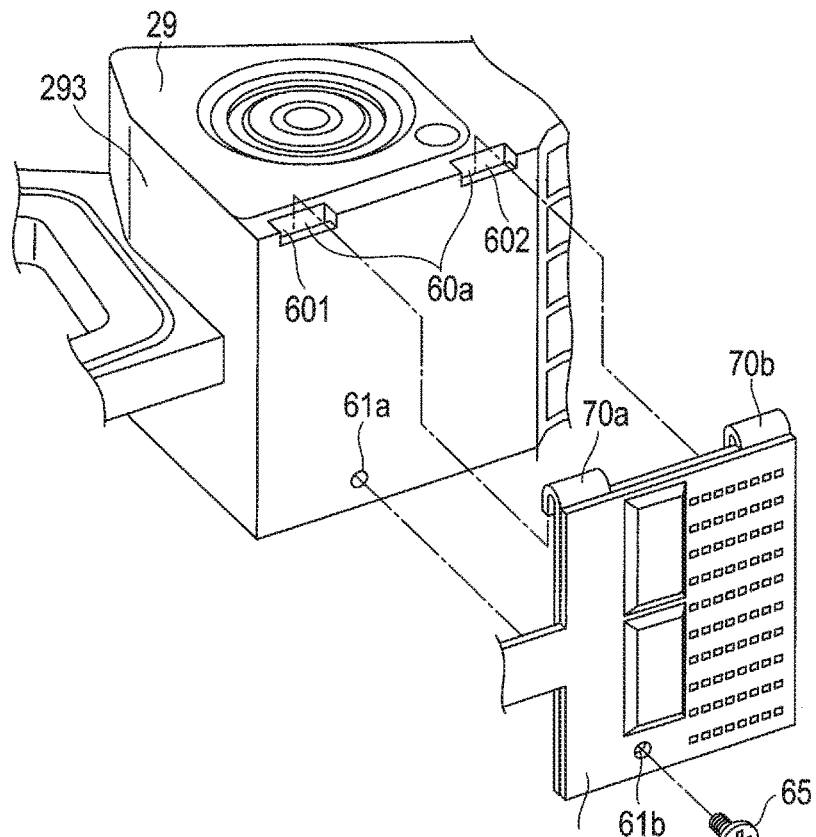
FIG. 10 is a perspective view showing a method of fixing the reinforcement plate according to a second modified example of the first embodiment.

FIG. 10 is a perspective view showing a method of fixing the reinforcing plate 80 according to a second modified example of the first embodiment. FIG. 11 is a perspective view showing a state in which the reinforcing plate 80 is fixed to the actuator block 29 in steps of FIG. 10. FIG. 12 is a cross-sectional view showing an actuator assembly 22 shown in FIG. 11 seen along line III-III'. The second modified example is different from the first modified example with respect to a feature that the first groove 60a is composed of two groove portions.

The first groove 60a includes a first grove portion 601 with which the first portion 70a is engaged and a second groove portion 602 with which the second portion 70b is engaged. The reinforcing plate 80 is arranged from the side surface 293 side in the first modified example, but is arranged from the installation surface 29a side in the second modified example. Thus, a force of locking the first portion 70a and the second portion 70b on the reinforcing plate 80 can be adjusted by adjusting the widths of the first groove portion 601 and the second groove portion 602 relative to the widths of the first portion 70a and the second portion 70b. The structure on the second end portion 802 side in the second modified example is the same as that in the first modified example.

Next, a second embodiment will be explained with reference to FIG. 13 to FIG. 15.

Figure 13:
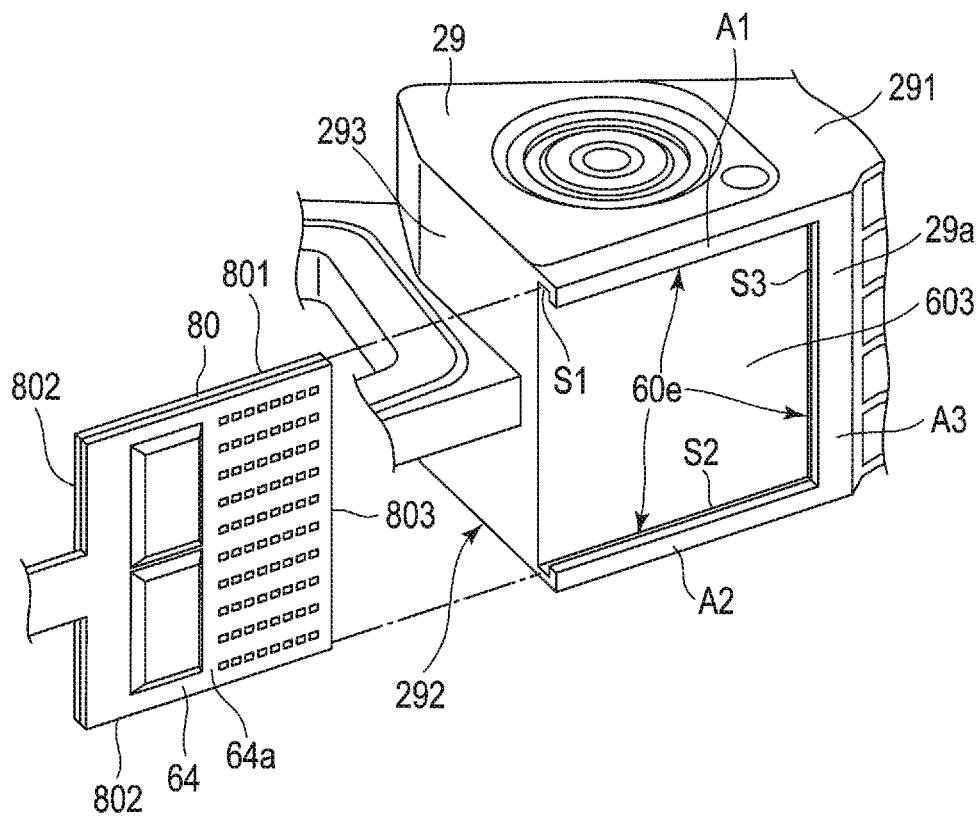
FIG. 13 is a perspective view showing a method of fixing the reinforcement plate according to a second embodiment.

FIG. 13 is a perspective view showing a method of fixing the reinforcing plate 80 according to the second embodiment. FIG. 14 is a perspective view showing a state in which the reinforcing plate 80 is fixed to the actuator block 29 in steps of FIG. 13. FIG. 15 is a cross-sectional view showing an actuator assembly 22 shown in FIG. 14 seen along line IV-IV'. The second embodiment is different from the first embodiment with respect to a feature that an actuator block 29 includes a supporting portion 60e formed on an installation surface 29a.

As shown in FIG. 13, the supporting portion supports the reinforcing plate 80 and the joint portion 64. The supporting portion 60e includes a first edge S1, a second edge S2, and a third edge S3 which rise from the installation surface 29a. The second edge S2 is located on a side opposite to the first edge S1, and the third edge S3 connects the first edge S1 and the second edge S2. The supporting portion 60e includes a first flange portion A1 projecting from the first edge S1 and extending along the first edge S1, a second flange portion A2 projecting from the second edge S2 and extending along the second edge S2, and a third flange portion A3 projecting from the third edge S3 and extending along the third edge S3.

Figure 14:
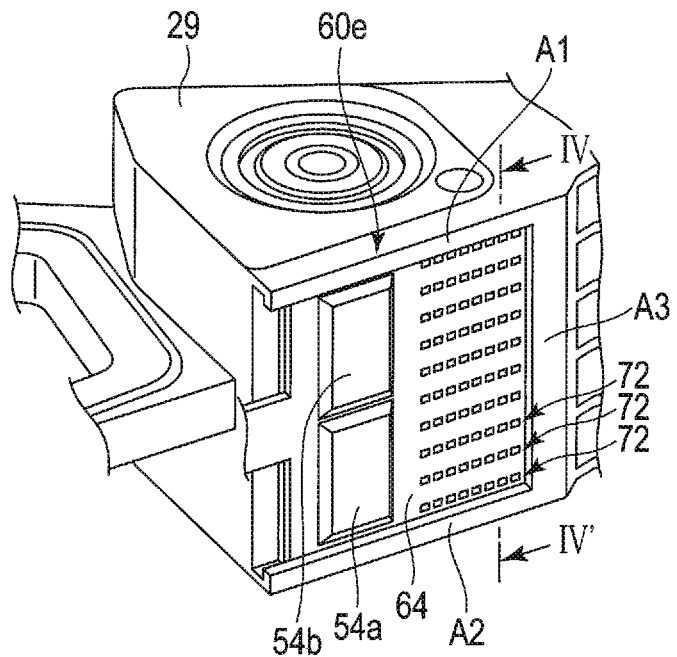
FIG. 14 is a perspective view showing a state in which the reinforcement plate is fixed to the actuator block in steps of FIG. 13.

As shown in FIG. 13 and FIG. 14, the reinforcing plate 80 is arranged on the installation surface 29a from the side surface 293 side. The first edge S1 abuts on a first end portion 801, the second edge S2 abuts on a second end portion 802, and the third edge S3 abuts on a third end portion 803. The first flange portion A1, the second flange portion A2, and the third flange portion A3 are in contact with a surface 64a of a joint portion 64. In addition, IC chips 54a and 54b and a connection pad group 72 are exposed from the supporting portion 60e.

Figure 15:
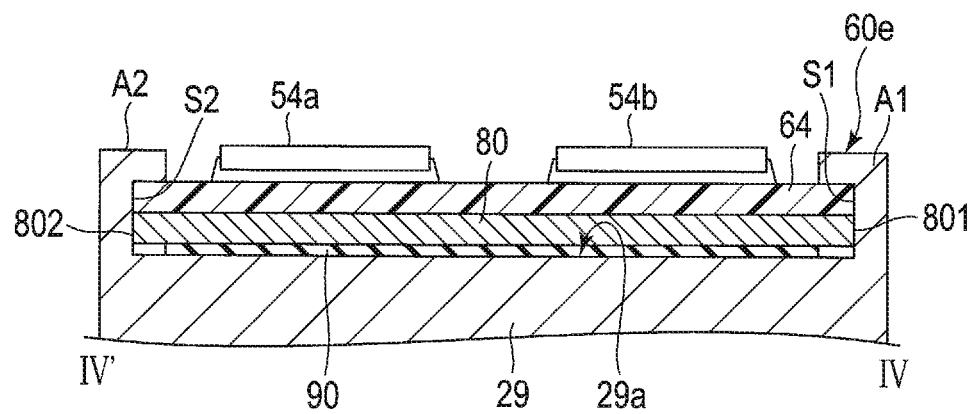
FIG. 15 is a cross-sectional view showing an actuator assembly shown in FIG. 14 seen along line IV-IV'.

As shown in FIG. 15, an adhesive material 90 bonds the reinforcing plate 80 to installation surface 29a inside the supporting portion 60e. As the bonding method, the adhesive material 90 is preliminarily attached to the reinforcing plate 80 or the installation surface 29a and then the reinforcing plate 80 is inserted into the supporting portion 60e. Alternatively, the adhesive material 90 may be arranged between the reinforcing plate 80 and the installation surface 29a after inserting the reinforcing plate 80 into the supporting portion 60e.

According to the second embodiment, the supporting portion 60e includes space in which the reinforcing plate 80 and the joint portion 64 can be inserted. For this reason, the supporting portion 60e includes space where the reinforcing plate 80 and the joint portion 64 can expand thermally, and can suppress concentration of the thermal stress. In addition, since the second embodiment does not include the steps of bending the first engaging portion 701 and the second engaging portion 702 of the first embodiment, the procedure of installing the reinforcing plate 80 can be simplified.

Next, a modified example of the second embodiment will be explained with reference to FIG. 16 to FIG. 18.

Figure 16:
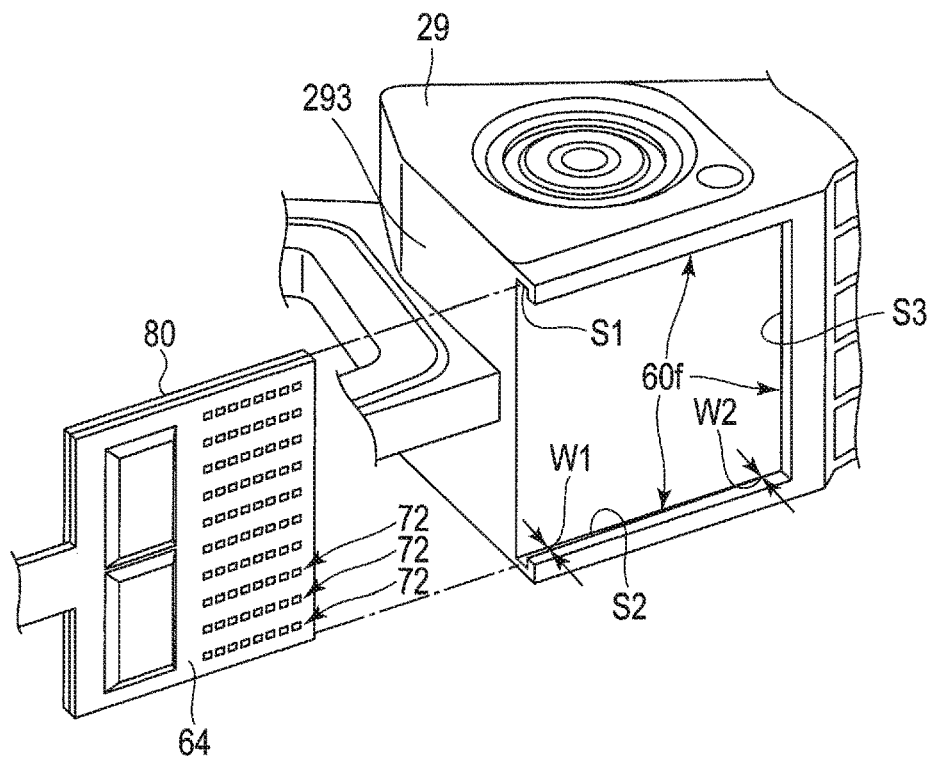
FIG. 16 is a perspective view showing a method of fixing the reinforcement plate according to a modified example of the second embodiment.
Figure 17:
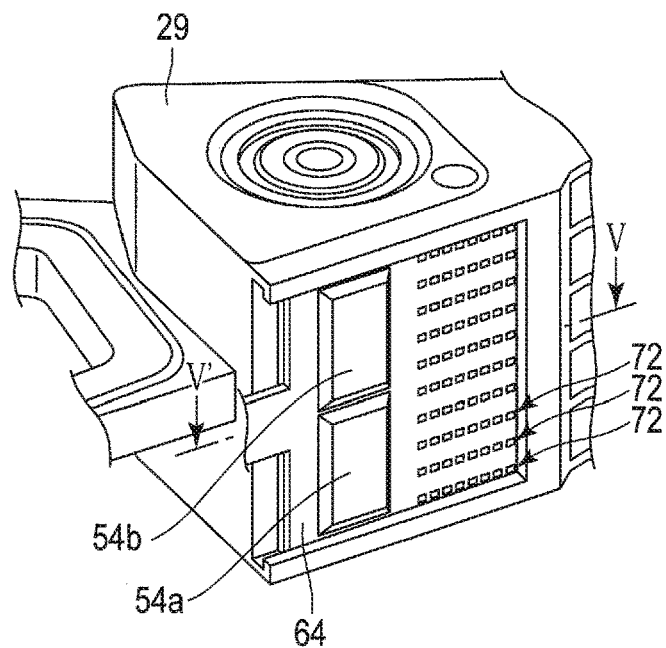
FIG. 17 is a perspective view showing a state in which the reinforcement plate is fixed to the actuator block in steps of FIG. 16.

FIG. 16 is a perspective view showing a method of fixing the reinforcing plate 80 according to the modified example of the second embodiment. FIG. 17 is a perspective view showing a state in which the reinforcement plate 80 is fixed to the actuator block 29 in steps of FIG. 16. FIG. 18 is a cross-sectional view showing an actuator assembly 22 shown in FIG. 17 seen along line V-V'. The modified example of the second embodiment is different from the second embodiment with respect to a width of the first edge S1 and the second edge S2.

As shown in FIG. 16, when a width of the second edge S2 at a position remote from the third edge S3 is referred to as width W1 and a width of the second edge S2 at a position close to the third edge S3 is referred to as width W2, the width W2 is smaller than the width 1. The widths of the first edge S1 are set similarly. In other words, the widths of the first edge S1 and the second edge S2 become smaller from the side surface 293 of the actuator block 29 to the third edge 53. In other words, the first edge S1 and the second edge S2 become shallower from the reinforcing plate 80 to a direction opposite to the direction of extension of an intermediate portion 62 of a flexible printed circuit board 100. For this reason, the reinforcing plate 80 and the joint portion 64 are firmly fixed on the third edge S3 side. That is, displacement of the connection pad group 72 to which connection end portions 48c are connected can be suppressed.

Figure 18:
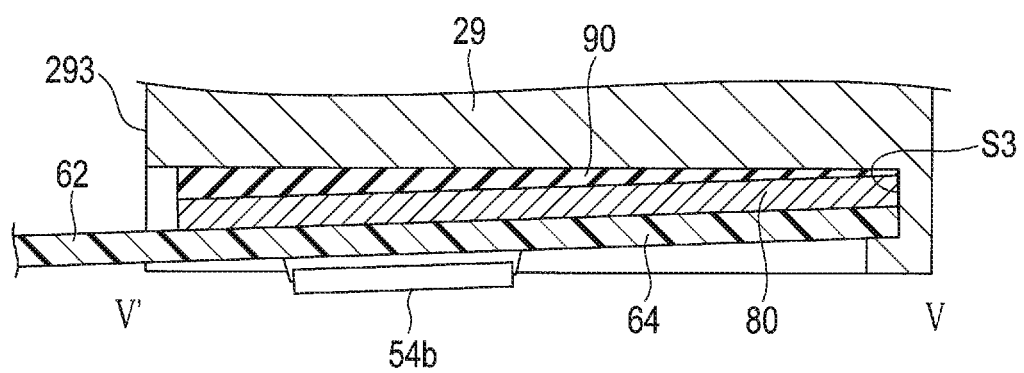
FIG. 18 is a cross-sectional view showing an actuator assembly shown in FIG. 17 seen along line V-V'.

As shown in FIG. 18, the reinforcing plate 80 and the joint portion 64 have a thickness which is substantially constant from the third edge S3 to the side surface 293, and the thickness of the adhesive material 90 becomes larger from the third edge S3 to the side surface 293. The width of each of the first edge S1 and the second edge S2 may be gradually varied or may be set at two stages to clearly form a region having a strong fixing force to the reinforcing plate 80 and a region having a weak fixing force to the reinforcing plate 80.

As explained above, the present embodiment can provide the actuator assembly for a disk device capable of increasing the area for mounting the flexible printed circuit board and capable of suppressing deformation of the flexible printed circuit board caused by thermal stress, and a disk device comprising the actuator assembly.

In the above-described second embodiment, the other constituent elements of the HDD are the same as those of the HDD according to the first embodiment.

The present invention is not limited to the above-described embodiments or modified examples, and the constituent elements of the invention can be modified in various ways without departing from the spirit and scope of the invention. Various aspects of the invention can also be extracted from any appropriate combination of constituent elements disclosed in the embodiments. For example, some of the constituent elements disclosed in the embodiments may be deleted. Furthermore, the constituent elements described in different embodiments may be arbitrarily combined.

In addition, the number of magnetic disks is not limited to five, but may be four or less or six or more, and the number of suspension assemblies and the number of magnetic heads may be increased or decreased according to the number of magnetic disks installed. The number of connection terminals can be increased or decreased as needed on the connection end portion of the suspension assembly. The materials, shapes, sizes, etc., of the elements which constitute the disk device are not limited to those in the above-described embodiments, and can be changed variously as needed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An actuator assembly comprising:
   a head actuator comprising an actuator block having a first surface, a second surface intersecting the first surface, and a first groove provided on the second surface, and a suspension assembly supporting a magnetic head; and
   a wiring board comprising a plate arranged on the first surface, a flexible printed circuit board provided on the plate, and an IC chip provided on the flexible printed circuit board,
   wherein the plate comprises a first hook engaging with the first groove.

2. The actuator assembly of claim 1, wherein the actuator block comprises a third surface opposed to the second surface and intersecting the second surface, and a second groove provided on the third surface, and the plate comprises a second hook engaging with the second groove.

3. The actuator assembly of claim 2, wherein the first hook comprises of a first portion and a second portion apart from the first portion, and the second hook comprises a third portion and a fourth portion apart from the third portion.

4. The actuator assembly of claim 1, wherein the actuator block comprises a third surface opposed to the second surface and intersecting the first surface, and the wiring board is fixed to the actuator block by a screw on the third surface side of the first surface.

5. The actuator assembly of claim 4, wherein the first hook comprises a first portion and a second portion apart from the first portion.

6. The actuator assembly of claim 5, wherein the first groove comprises a first groove portion with which the first portion is engaged and a second groove portion with which the second portion is engaged.

7. A disk device comprising: a disk-shaped recording medium including a recording layer; and the actuator assembly of claim 1.

8. The disk device of claim 7, wherein the actuator block comprises a third surface opposed to the second surface and intersecting the first surface, and a second groove provided on the third surface, and the plate comprises a second hook engaging with the second groove.

9. The disk device of claim 8, wherein the first hook comprises a first portion and a second portion apart from the first portion, and the second hook comprises a third portion and a fourth portion apart from the third portion.

10. The disk device of claim 7, wherein the actuator block comprises a third surface opposed to the second surface and intersecting the first surface, and the wiring board is fixed to the actuator block by a screw on the third surface side of the first surface.

11. The disk device of claim 10, wherein the first hook comprises a first portion and a second portion apart from the first portion.

12. The disk device of claim 11, wherein the first groove comprise a first groove portion with which the first portion is engaged and a second groove portion with which the second portion is engaged.

13. The actuator assembly of claim 1, wherein the first hook is positioned on a first end portion of the plate, and the first end portion is located on the second surface side of an actuator block.

14. The actuator assembly of claim 13, wherein the first groove extends in a direction in which the first end portion of the plate extends.

15. The actuator assembly of claim 2, wherein the second hook is positioned on a second end portion of the plate, and the second end portion is opposite to the first end portion.

16. The actuator assembly of claim 15, wherein the second groove extends in a direction which the second end portion of the plate extends.

17. The actuator assembly of claim 1, wherein the first hook comprises a distal portion disposed within the first groove, and a second portion comprising a curved portion of the first hook extending from the distal portion and the first groove.

18. The disk device of claim 7, wherein the first hook comprises a distal portion disposed within the first groove, and a second portion comprising a curved portion of the first hook extending from the distal portion and the first groove.

* * * * *